United States Patent

[11] 3,611,070

[72] Inventor William E. Engeler
Scotia, N.Y.
[21] Appl. No. 46,021
[22] Filed June 15, 1970
[45] Patented Oct. 5, 1971
[73] Assignee General Electric Company
Continuation-in-part of application Ser. No. 766,546, Oct. 10, 1968, now abandoned.

[54] VOLTAGE-VARIABLE CAPACITOR WITH CONTROLLABLY EXTENDIBLE PN JUNCTION REGION
11 Claims, 18 Drawing Figs.

[52] U.S. Cl. .......... 317/235, 29/576, 30/320
[51] Int. Cl. .......... H01l 11/14
[50] Field of Search .......... 317/235, 234, 235 B, 235 UA

[56] References Cited

UNITED STATES PATENTS

| | | | |
|---|---|---|---|
| 3,056,888 | 10/1962 | Atalla | 317/235 X |
| 3,339,128 | 8/1967 | Olmstead et al. | 317/235 |
| 3,374,406 | 3/1968 | Wallmark | 317/235 |
| 3,411,053 | 11/1968 | Wiesner | 317/235 |
| 3,562,608 | 2/1971 | Gallagher | 317/235 |

OTHER REFERENCES

Electronic Industries, December 1959; pages 90–94, an article titled: Voltage-Variable Capacitors– of the Art.

*Primary Examiner*—James D. Kallam
*Attorneys*—John F. Ahern, Paul A. Frank, Jerome C. Squillaro, Frank L. Neuhauser, Oscar B. Waddell and Joseph B. Forman

ABSTRACT: A PN junction region formed in a portion of a semiconductor wafer extends beneath the edge of a resistive layer coated on an insulating layer atop the wafer. Voltage applied across the resistive layer may be adjusted in amplitude, with respect to the wafer, to invert at least a fraction of the wafer surface extending from the PN junction beneath a proportionate fraction of the resistive layer. By varying this voltage, the area of the wafer which is inverted is made to vary accordingly, thereby varying capacitance measured across the device. By appropriately shaping the resistive layer, a predetermined capacitance-voltage characteristic may be obtained.

Fig. 1.
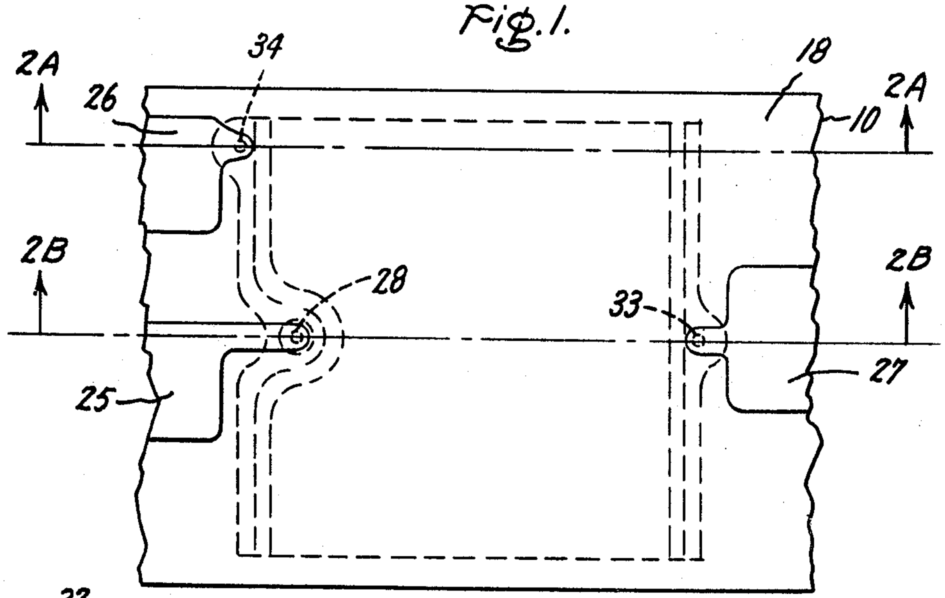
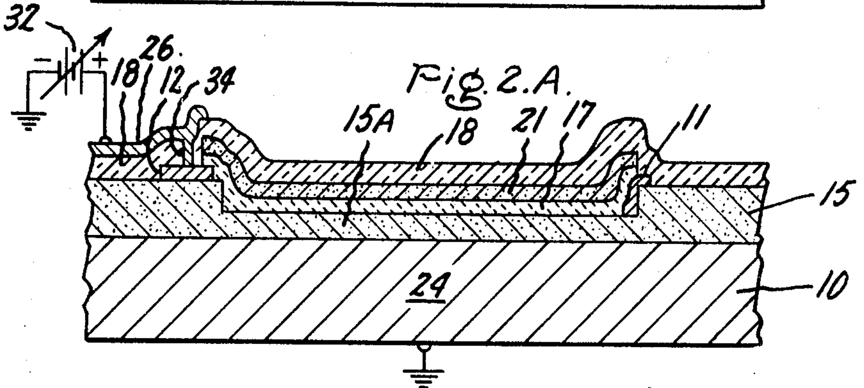
Fig. 2.A.
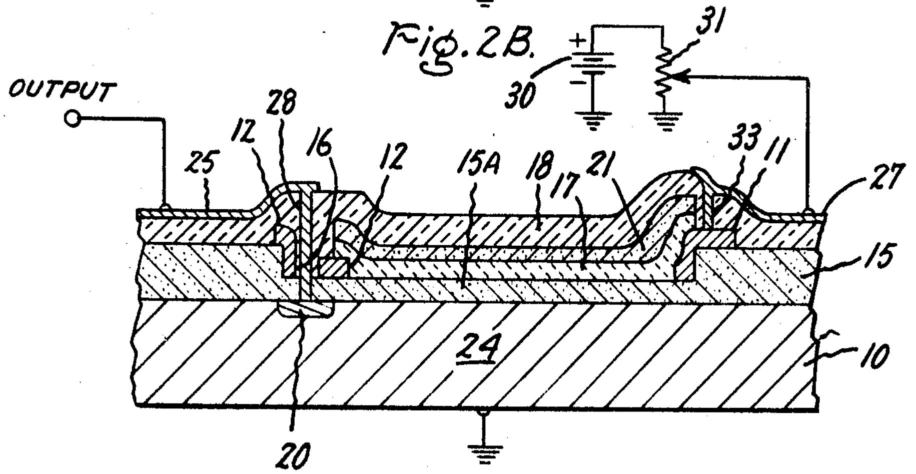
Fig. 2B.
Inventor:
William E. Engeler,
by Marvin Snyder
His Attorney.

Inventor:
William E. Engeler,
by Marvin Snyder
His Attorney.

Inventor:
William E. Engeler,
by Marvin Snyder
His Attorney.

Inventor:
William E. Engeler,
by Marvin Snyder
His Attorney.

Inventor:
William E. Engeler,
by Marvin Snyder
His Attorney.

INVENTOR:
WILLIAM E. ENGELER,
by Jerome C. Squillaro
HIS ATTORNEY

VOLTAGE-VARIABLE CAPACITOR WITH CONTROLLABLY EXTENDIBLE PN JUNCTION REGION

INTRODUCTION

This application is a continuation-in-part of Ser. No. 766,546 filed Oct. 10, 1968, now abandoned, and is related to the following copending applications: W. E. Engeler Ser. No. 766,491 filed Oct. 10, 1968 Pat. No. 3,535,600: and R. A. Sigsbee Ser. No. 766,605 filed Oct. 10, 1968 Pat. No. 3,560,815.

This invention relates to variable capacity diodes, and more particularly to a diode wherein capacitance may be increased by establishing a surface inversion region of controllable length to controllably extend the area of an initial PN junction.

Many electrical circuits require variable capacitors in their operation . A voltage controllable variable capacitor is especially useful, finding applicability in AM and FM radio receivers, and television receivers. Such device must exhibit a large, continuously variable capacitance with applied voltage. Both conventional PN junction diode variable capacitors and conventional metal-oxide-semiconductor (MOS) variable capacitors employ an essentially constant active area (or area in which an applied electric field has an appreciable effect upon charge carriers), with capacitance in the PN junction diode capacitor being varied by electrically varying the thickness of the depletion region at the junction and capacitance in the MOS capacitor being varied by electrically varying the thickness of the depletion region at the semiconductor-oxide interface. A large range of capacitance ratio, or ratio of maximum capacitance to minimum capacitance, thus requires a thin initial depletion layer in the PN junction device or a thin oxide layer in the MOS device. The capacitance ratio in these conventional devices, however, is restricted by the constant area of electrically active material.

In the voltage-variable capacitor of the aforementioned Sigsbee application, a larger ratio of maximum capacitance to minimum capacitance than possible with the aforementioned conventional variable capacitors is achieved by employing a semiconductor wherein the active area of the device may be extended beneath a field control plate. This extension of the active area is a consequence of the capability to establish a surface inversion layer (or shallow region extending from the surface into the semiconductor wafer in which majority carriers are depleted and minority carriers are attracted close to the surface) which reaches into the initial active area in the semiconductor. This permits a much larger variation in capacitance ratio than obtainable in conventional semiconductor variable capacitors since, in addition to the normal variation in depletion width with voltage, the increase in active area of the device causes an increase in capacitance value.

The present invention concerns a three-terminal type of device wherein capacitance variation is due entirely to variation of active area in the device and represents a modification of the aforementioned Sigsbee application in that provision is made for controllably establishing a surface inversion layer; that is, the initial active area in the semiconductor may be controllably enlarged gradually or even substantially instantaneously, so that capacitance variation may be made as gradual or as rapid as desired. This is accomplished by supplying a control voltage to the third terminal independently of any voltage across the capacitor itself. By controlling the extent of the electric field on the semiconductor, the inversion layer may be extended to cover any desired portion of the surface area of the semiconductor. Moreover, although the device is operative with DC bias across the capacitor, such DC bias is not required in order to achieve capacitance variation. This permits parallel operation with a low impedance circuit element, such as an inductor coil, without requiring any additional circuit elements in the circuit. Furthermore, by appropriately shaping the geometry of the electric field on the semiconductor, an infinite variety of capacitance vs voltage characteristics may be obtained.

Accordingly, one object of the invention is to provide a capacitor having a capacitance value which is selectable with an independently applied voltage.

Another object is to provide a voltage-variable capacitor which is compatible with integrated circuits.

Another object is to provide a semiconductor junction diode in which an initial active area may be controllably extended to a desired size by establishing a surface inversion layer of controllable area in the semiconductor.

Another object is to provide a variable capacitor having a capacitance-voltage characteristic which may be selected by geometrically shaping the area of an electric field establishing a surface inversion layer to extend the initial active area in a semiconductor containing a PN junction.

Another object is to provide a semiconductor junction diode which exhibits a variable capacitance requiring no DC bias across the capacitor output terminals.

Yet another object is to provide a variable capacitor having a high surface capacitance and a low junction capacitance.

Briefly, in accordance with one preferred embodiment of the invention, a finely controllable voltage-variable capacitor comprises a semiconductor wafer of one type conductivity with a region of opposite type conductivity diffused into a first portion of the wafer and extending to a predetermined depth beneath one surface thereof. Resistive means insulated from the one surface of the wafer are disposed above a second portion of the wafer, with an edge overlapping the first portion thereof. Means are provided for applying a variable voltage across the resistive means and a variable voltage across the resistive means and the wafer. A surface inversion layer of controllable length is thus established in the wafer beneath the resistive means by virtue of a potential gradient across the resistive means. Output means are connected across the region of opposite type conductivity and the remainder of the wafer in order to exhibit a controllably variable output capacitance. In another embodiment a surface adjacent region of lower resistivity than the semiconductor wafer provides a variable area capacitor having a high surface capacitance and a low junction capacitance.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 1 is a plan view of one embodiment of the invention as fabricated upon a semiconductor wafer;

FIGS. 2A and 2B are cross-sectional views of the embodiment of the invention illustrated in FIG. 1, showing typical electrical circuit connections thereto;

DESCRIPTION OF TYPICAL EMBODIMENTS

Figure 3:
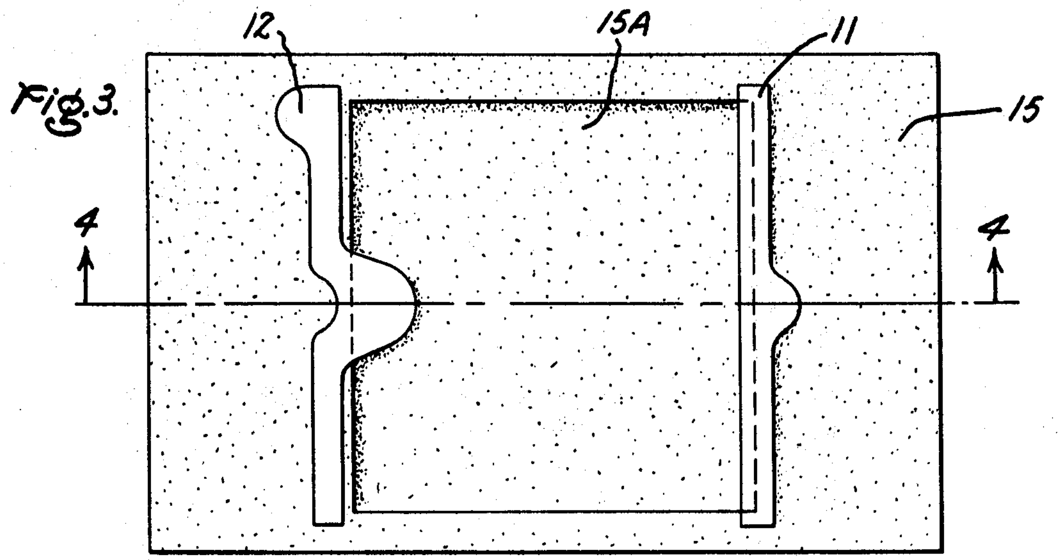
FIGS. 3–9 are illustrations to aid in understanding the steps employed in fabricating the embodiment of FIGS. 1, 2A and 2B.

In FIG. 1, a top view of a portion of an integrated circuit is illustrated wherein a coating of glass 18 overlays a wafer 10 of semiconductor material such as silicon. A plurality of metallic contact pads 25, 26 and 27 provide facility for making electrical contact to the device. It should be noted that although the structure of FIG. 1 is described as comprising a portion of an integrated circuit, the device of the present invention may, in the alternative, be fabricated as a discrete device.

In FIGS. 2A and 2B, which are sectional views of the structure of FIG. 1 taken along lines 2A—2A and 2B—2B, respectively, wafer 10 is shown comprising a region of one type conductivity. For illustrative purposes, it will be assumed that the wafer is silicon and the one type conductivity is P type. Wafer 10 is, therefore, doped with acceptor impurities to a level which results in a resistivity in the order of 0.1 to 10 ohm-centimeters. Typical acceptor impurities which may be employed include boron, aluminum, gallium and indium.

Silicon dioxide layer 15, as shown in FIGS. 2A and 2B, is formed atop silicon layer 10 to a thickness typically about 700 Angstroms in region 15A, with end regions thereof typically in the order of 1 micron thickness. Metallic layers 11 and 12 overlap from the thinner portion 15A of layer 15 onto the thicker portions at each end thereof. Metallic layer 12, in the portion shown in FIG. 2A, contains an opening 16 therein. Layer 17 resistive material is coated atop a portion of insulating layer 15 preferably to a thickness resulting in sheet resistivity in the order of $10^7$ ohms per square. Resistive layer 17, which is thus insulatedly disposed atop a portion of the surface of wafer 10, is patterned to overlap onto, and thus make electrical contact with, metallic regions 11 and 12 so as to form a surface field controlling means. It should be noted that resistive layer 17 may be formed in any desired geometrical shape through the proper mask so as to achieve any desired capacitance-voltage characteristic for the device, only provided that contact at either end thereof is made to metallic regions 11 and 12.

An insulating layer 21, such as of silicon nitride, is formed atop resistive layer 17 substantially coextensive therewith, and an additional insulating layer 18, in turn, may be deposited over the entire device. Region 20 contains a dopant of conductivity type opposite to the dopants in the remainder of semiconductor wafer 10. In this instance, therefore, region 20 contains a donor impurity, such as phosphorous. This forms a diffused N-type region 20 in wafer 10, as shown in FIG. 2A, leaving a P-type region 24. Typically, the thickness of N-type region 20 is about 1 micron while the doping level thereof is in the order of $10^{20}$ donor atoms per cubic centimeter. It should be noted that a portion of region 20 extends beneath a portion of metal region 12 so as to extend beneath the surface field controlling means.

Contact pad 25 including a region 28 makes contact with diffused region 20 of wafer 10 by virtue of extended portion 28 passing through insulating layers 15A and 18. This is illustrated in FIG. 2B. Similarly, pads 26 and 27, shown in FIGS 2A and 2B respectively, make contact with metallic regions 11 and 12 respectively through extended portions 33 and 34 respectively passing through insulating layer 18. The entire device may be mounted conventionally on a header (not shown).

For the assumed semiconductor conductivity types herein described, a positive bias is applied to one end of resistive layer 17, as illustrated in FIG. 2B, by connecting a DC power source 30 in parallel with a potentiometer 31, which may be variable, and connecting the potentiometer tap to metallic strip 11 through contact pad 27. This bias, of itself, is below the threshold level required to invert any portion of semiconductor wafer 10 at the interface with silicon dioxide layer 15. In addition, a positive control voltage is supplied to the opposite end of resistive layer 17 from a variable DC power source 32 through contact pad 26, as illustrated in FIG. 2A. The variable capacitance output of the device is furnished from contact pad 25, shown in FIG. 2B, with respect to ground. P-type region 24 of wafer 10 is grounded, as through a header (not shown).

In operation, those regions on resistive layer 17 which are positively charged establish an electric field on semiconductor wafer 10 which tends to repel majority charge carriers, here holes, away from the silicon-silicon dioxide interface directly beneath resistive layer 17. This establishes a depletion region in semiconductor 10 adjacent this interface directly beneath the portion of silicon dioxide region 15A supporting resistive layer 17; that is, in this region the net concentration of charge carriers is decreased considerably below the concentration of uncompensated acceptor ions. The depletion region assumes the areal shape and dimensions of that portion of resistive layer 17 (and metallic regions 11 and 12) which is positively charged and is situated directly above the thin silicon dioxide region 15A. Due to the uniform thickness and resistivity of resistive layer 17, the voltage gradient along layer 17 is uniform and dependent upon the difference between the voltages applied to conductive strips 26 and 27.

In the regions where the positive voltage on resistive layer 17 is higher in amplitude, minority charge carriers, here electrons, are attracted to the surface of semiconductor wafer 10 at the interface with silicon dioxide layer 15 in the region beneath the portion of resistive layer 17 (and metallic regions 11 and 12) coated on the thin portion 15A of silicon dioxide layer 15. When the voltage amplitude on resistive layer 17 is increased beyond a threshold level, minority charge carriers (here electrons) beneath this portion of resistive layer 17 which is atop thin portion 15A of silicon dioxide layer 15 arrange themselves to be in equilibrium with the DC bias on that end of resistive layer 17. In the portion of semiconductor material in which this occurs, which is the portion of semiconductor wafer 10 near the interface with the thin portion 15A of silicon dioxide layer 15, the semiconductor material is inverted. By making the voltage on contact pad 26 more positive than the voltage on contact pad 27, the inverted region merges with N-type region 20 due to metallic region 12 atop thin silicon dioxide region 15A at the edge of resistive layer 17 overlapping a portion of N-type region 20. At this juncture, electrical contact to the inverted region is furnished by the source of electrons in N-type region 20. Thereafter, as voltage amplitude of resistive layer 17 is increased still further, the extent of the inverted region from N-type region 20 similarly increases, so that an increasingly greater portion of semiconductor wafer 10 near the interface with silicon dioxide layer 15 becomes inverted. In this manner, the active area of the device is made to extend controllably through the area of semiconductor wafer 10 situated beneath resistive layer 17 (and metallic regions 11 and 12 atop thin silicon dioxide region 15A), spreading outwardly from diffused region 20 shown in FIG. 2A.

As the area of the active region enlarges, the device capacitance enlarges accordingly. Conversely, as the amplitude of voltage on resistive layer 17 decreases from some value at which capacitance has been increased, the active area of the device diminishes accordingly. Thus, it is apparent that a change in voltage at any point on resistive layer 17 with respect to grounded P-type region 24 of wafer 10 causes a redistribution of charge along the silicon-silicon dioxide interface, so that the device is, in effect, a capacitor having a width between conductive plates which is that of the depletion layer width and having a dielectric constant which is that of silicon. In this fashion, the capacitance of the device may be precisely controlled.

It should be noted that any variation in output voltage on the tap of potentiometer 31 tends to change the extent of the active area in the device if a portion of wafer 10 has been inverted, since this voltage produces a positive bias which appears over the entire extent of resistive layer 17. Adjustment of the size of power source 32 controls the rate at which the device increases or decreases in capacitance, since it controls the voltage gradient across layer 17.

Figure 4:
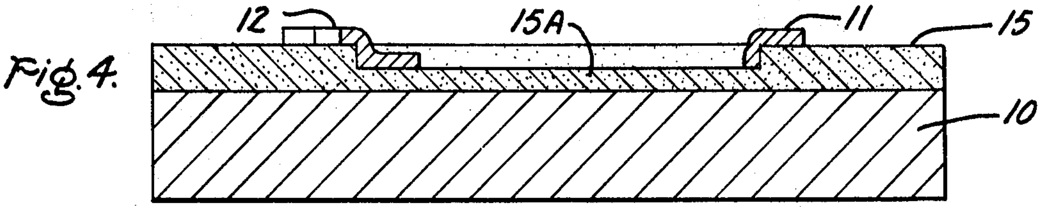

Fabrication of the device illustrated in FIGS. 1, 2A and 2B may be accomplished by steps such as those illustrated in FIGS. 3–8. Accordingly, in FIG. 3, wafer 10 is illustrated with silicon dioxide region 15 formed thereon. The thin region 15A is formed after region 15 has been formed. The silicon dioxide region to be made thin is etched by photolithographic techniques employing photoresist compounds and a new layer of silicon dioxide is formed over the entire device. Thereafter, molybdenum contacts 11 and 12 are formed by sputtering molybdenum over the entire surface of the wafer and patterning the molybdenum by photolithographic techniques. FIG. 4 is a cross-sectional view of FIG. 3 taken along lines 4—4, which further serves to illustrate the topology of the device.

Figure 5:
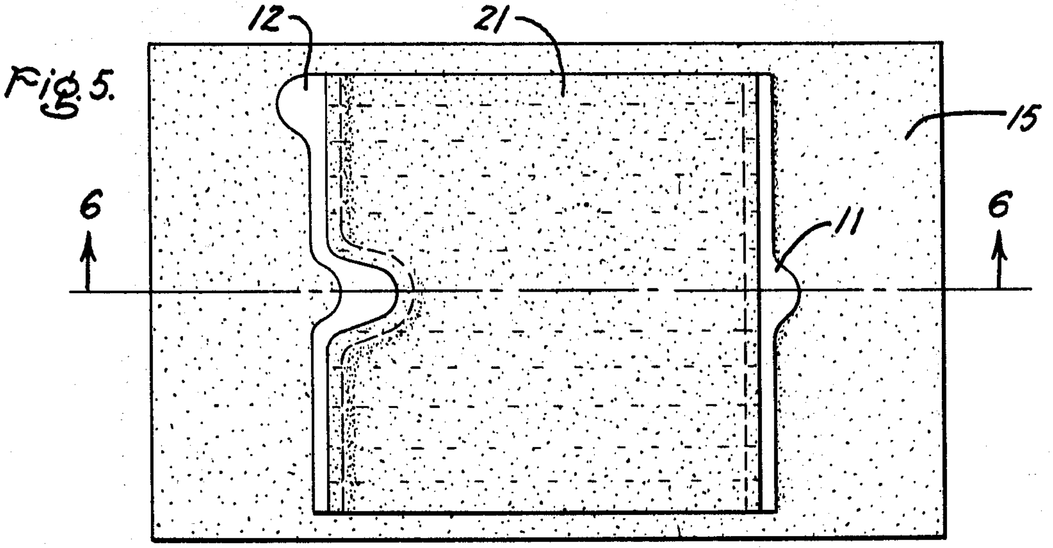
Figure 6:
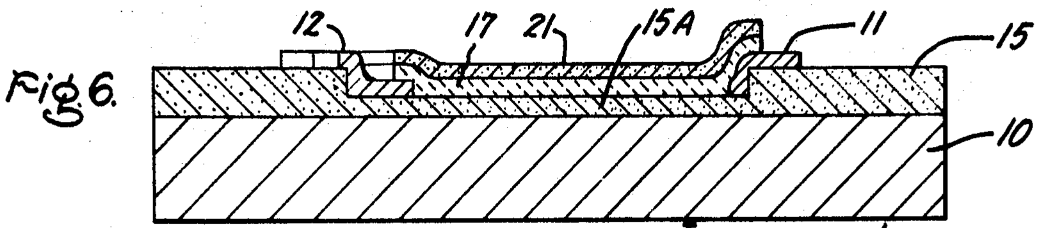

FIG. 5 illustrates the device after resistive layer 17 has been deposited atop a pattern of photoresist material and a layer of silicon nitride has been deposited atop the resistive layer, followed by removal of the photoresist pattern. To perform these steps, the resistive layer may be fabricated by reactively sputtering chromium in a slight presence of nitrogen to form chromium nitride or, in the alternative, resistive silicon may be formed by sputtering silicon onto the substrate heated to a temperature of about 200°C. The structure of FIG. 5, as viewed along line 6—6, may be seen in cross-sectional form in FIG. 6.

Figure 7:
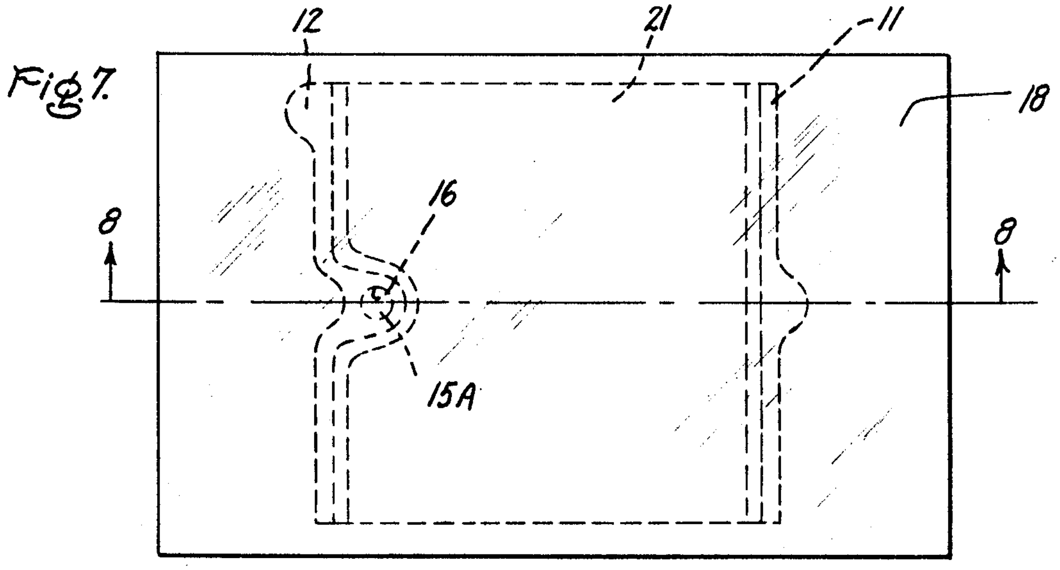
Figure 8:
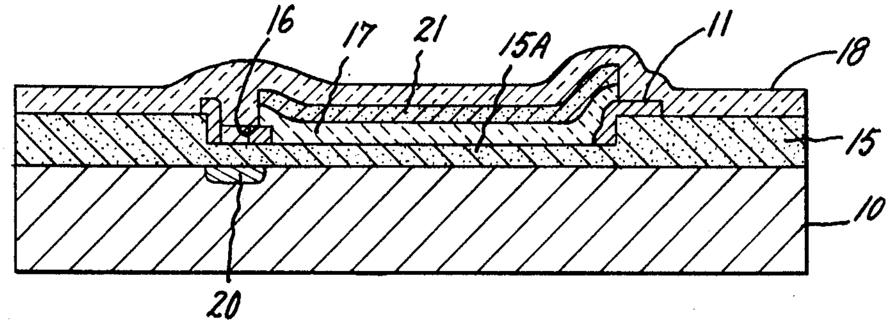

As illustrated in plan view in FIG. 7, a hole 16 is next etched in molybdenum region 12, by employment of photolithographic techniques, down to the surface of the thin region 15A of silicon dioxide layer 15. In order to form diffused region 20, the entire structure is then coated with a phosphorous doped glass layer 18 which may be applied by pyrolytically depositing ethyl orthosilicate and triethyl phosphate, using argon carrier gas, as described in D. M. Brown et al. application Ser. No. 675,228 filed Oct. 13, 1967, now U.S. Pat, No. 3,566,517 and assigned to the instant assignee. Thereafter, the entire structure is heated at a temperature of about 1,000°C for about 1½hours in order to diffuse donor impurities from glass layer 18 into wafer 10 through thin region 15A of silicon dioxide layer 15 forming an N-type region 20 to a depth of approximately 1 micron below the silicon-silicon dioxide interface. N-type region 20 is illustrated in FIG. 8, which is a cross-sectional view of the structure of FIG. 7 as viewed along line 8—8. The donor concentration in region 20 is in the order of $10^{20}$ atoms per cubic centimeter. It should be noted that the diameter of diffused region 20 is made as small as possible, in order to maintain the initial capacitance of the device at as small a value as possible. This maximizes the range of capacitance ratio, or ratio of maximum capacitance to minimum capacitance.

Figure 9:
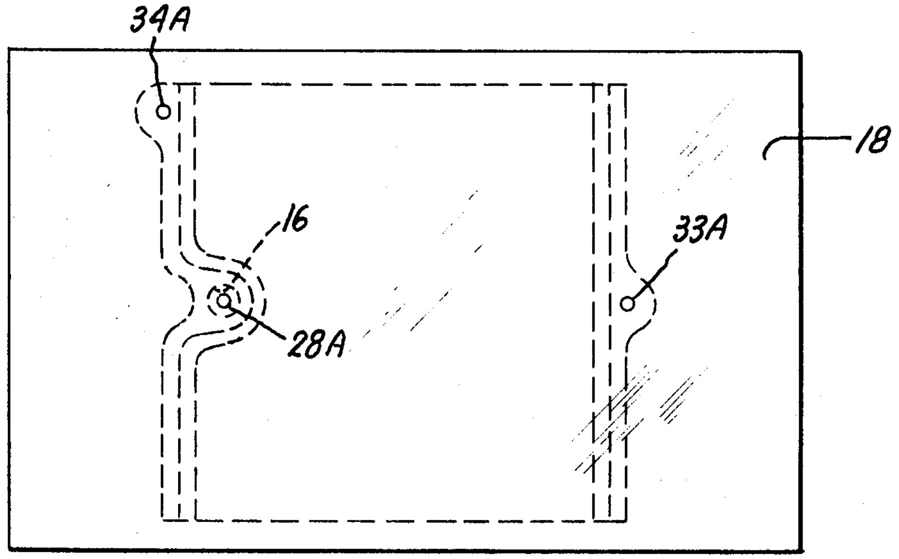

With the aid of photolithographic techniques, openings 33A and 34A, shown in FIG. 9, are etched above molybdenum regions 11 and 12 respectively through doped glass layer 18 in order to permit making electrical contact to the molybdenum regions. In addition, doped layer 18 is etched to form a hole 28A in the region above opening 16 in molybdenum layer 12. This hole is etched through the underlying silicon dioxide region, permitting electrical contact to be made to diffused region 20 from above doped glass layer 18. Thereafter, aluminum is deposited over the device and etched through a photolithographically produced mask in order to produce contact pad 25 and its extended region 28, together with contact pads 26 and 27 with their extended regions 34 and 33 respectively, as illustrated in FIGS. 1, 2A and 2B. Holes 28A, 33A and 34A are thus entirely filled with aluminum in the form of regions 28, 33 and 34, respectively.

In the alternative, the molybdenum layer from which contact regions 11 and 12 are formed may be patterned so as to extend regions 11 and 12 over the entire surface of silicon dioxide layer 15A. In this instance, deposition of layer 17, which may comprise molybdenum nitride, may be deferred until after deposition of layer 18 and diffusion of region 20. Layer 18 and extended portions of regions 11 and 12 may be removed by employment of photolithographic techniques and etchants as hereinbefore mentioned.

In still another alternative method of fabrication, region 20 may be diffused by forming an opening in oxide layer 15A coextensive with the aforementioned opening 16 and diffusing impurities into wafer 10 prior to the deposition of resistive region 17 and its contact regions 11 and 12. The remainder of region 15A, together with any contaminating glass formed during the diffusion process, is then removed and a new layer of silicon dioxide 15A is regrown by thermal oxidation, as before. The remainder of the fabrication process proceeds as before, except that insulating layer 18 need not be doped and no further diffusion is necessary.

Figure 10:
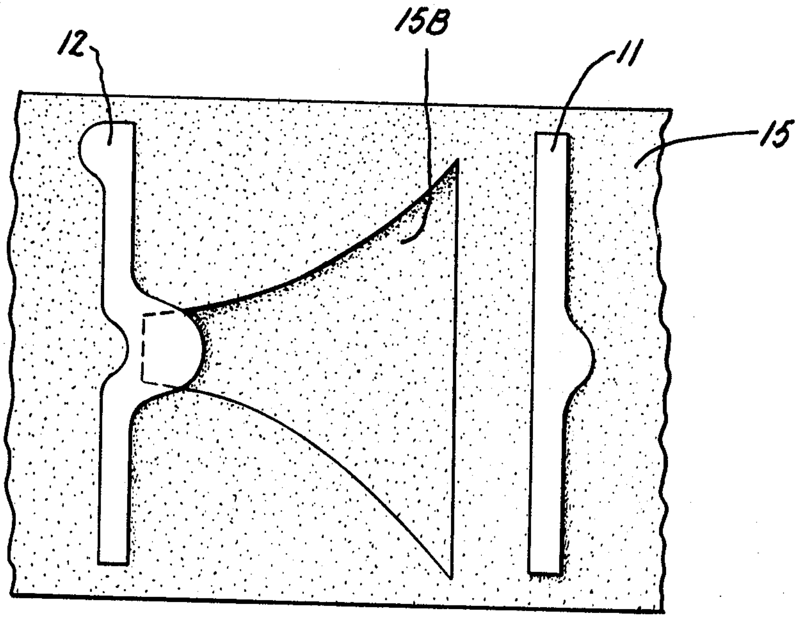
FIGS. 10 and 11 are illustrations to aid in understanding the steps employed in fabricating a second embodiment of the invention.
Figure 11:
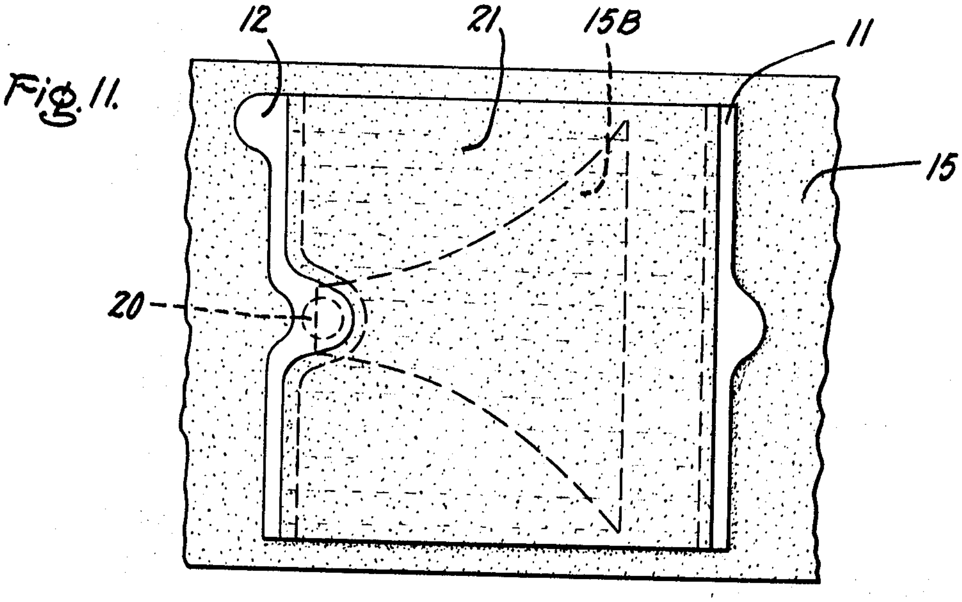

As hereinbefore noted, it is possible to obtain infinite variations of capacitance with voltage by appropriately shaping resistive layer 17. Alternatively, however, the thin region 15A of silicon dioxide layer 15 may be so shaped. This is because in either case, the electric field which produces the surface inversion layer is shaped accordingly. Thus as an example, FIG. 10 is a plan view of a device at a stage in fabrication similar to that of the structure shown in FIG. 3. The structure of FIG. 10 is substantially identical to the structure of FIG. 3 with the exception that region 15B, the thin region of silicon dioxide layer 15, is shaped to obtain a desired variation of capacitance with voltage applied to the terminals of the final device. FIG. 11 is an illustration of the structure at a subsequent stage, and is substantially similar to the structure shown in FIG. 5 with the exception that silicon dioxide layer 15 contains thin region 15B of predetermined shape to obtain a desired variation of capacitance with voltage applied to the terminals of the final device. In FIG. 11, the relative location of diffused region 20 is also illustrated.

Figures 12, 12A:
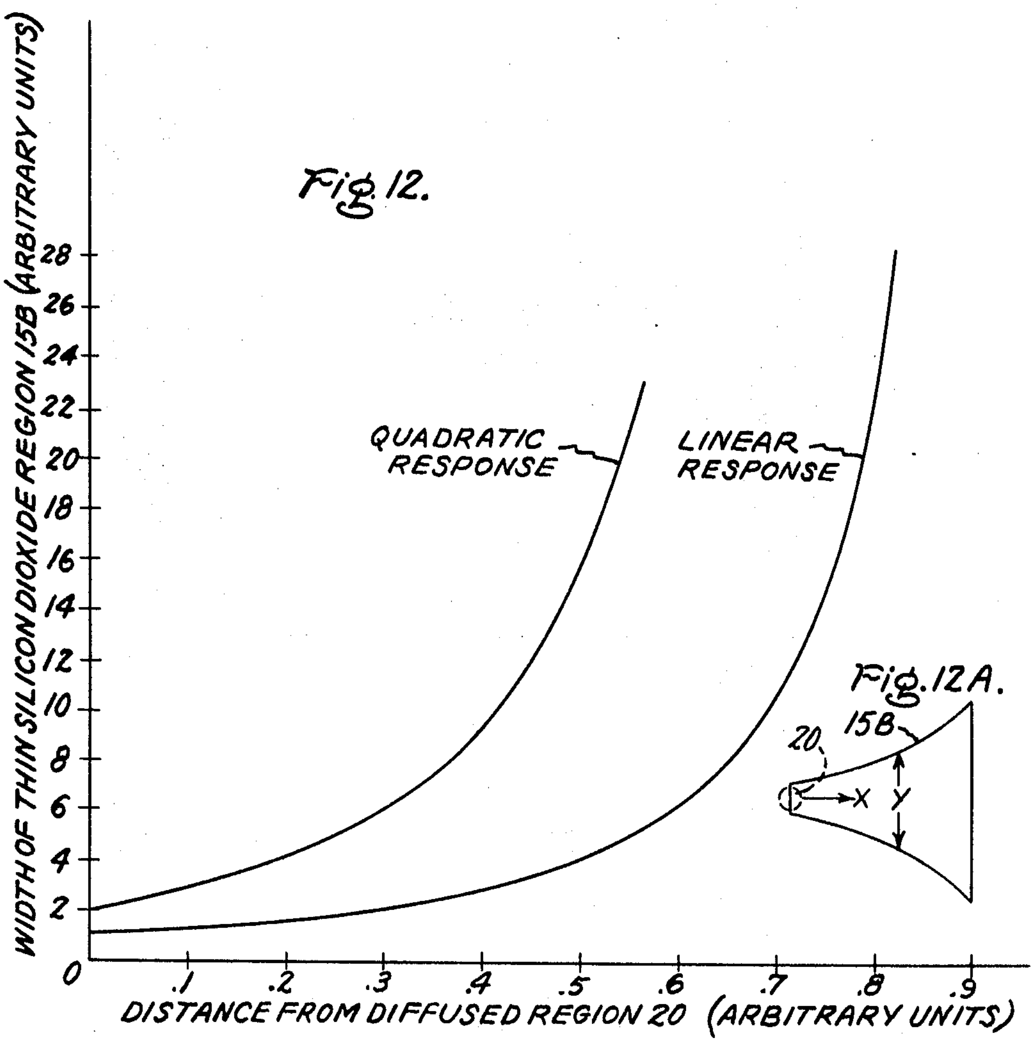
FIGS. 12 and 12A are representations to aid in proportioning an insulating layer on the device in order to obtain a desired capacitance-voltage characteristic.

FIG. 12 illustrates two shapes used when a device is fabricated according to the teachings of the instant invention so that the thin region 15B of silicon dioxide layer 15 is shaped as shown in FIGS. 10 and 11 to obtain a desired response. The curves of FIG. 12 are plotted for the same arbitrary units on both the ordinate and abscissa with the ordinate or Y coordinate representing the width of thin silicon dioxide region 15B and the abscissa or X coordinate representing distance from the diffused region. Both the X and Y distance measurements are made in the silicon dioxide region 15B in a plane parallel to the silicon-silicon dioxide interface, as illustrated in inset FIG. 12A. Thus, to obtain a linear response, or linear change in capacitance with voltage, the X and Y dimensions of region 15B are selected from the linear response curve. Similarly, to obtain a quadratic response or quadratic change in capacitance with respect to voltage, the X and Y dimensions of region 15B are selected from the quadratic response curve.

Figure 13:
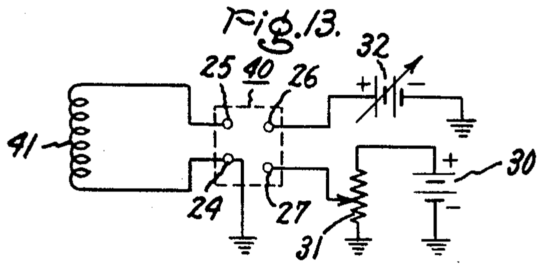
FIG. 13 is a schematic diagram of a novel circuit facilitated by employment of the voltage-variable capacitor of the instant invention.

In FIG. 13, a major advantage of the device shown in FIGS. 1, 2A and 2B, and indicated with like numerals is illustrated. The device 40 is shown with an inductance 41 of low DC resistance connected directly across contact pad 25 and a contact to the P-type region 24 of the device. Thus, the shunt combination of fixed inductance 41 and the variable capacitance between contacts 24 and 25 results in a tank circuit which is tuneable with variation in voltage from DC source 32. The advantage of this circuit, as provided by voltage-variable capacitor 40, is that no DC bias or control voltage need be applied across contacts 24 and 25. This permits employment of inductance 41 in shunt with variable capacitor 40 in the tuneable tank circuit without need for a blocking capacitor, series resistance, or any other technique to permit application of DC to the output of the capacitor without drawing excessive current from the DC power supply.

The foregoing describes a capacitor which is compatible with integrated circuits and has a capacitance which is selectable with an independently applied voltage. The capacitor comprises a semiconductor junction diode in which an initial active area may be controllably extended to a desired size by establishing a surface inversion layer of controllable area in the semiconductor. The capacitance-voltage characteristic of the device may be selected by geometrically shaping the area of an electric field establishing the surface inversion layer. The diode exhibits a variable capacitance requiring no DC bias across the capacitor output terminals.

Figure 14:
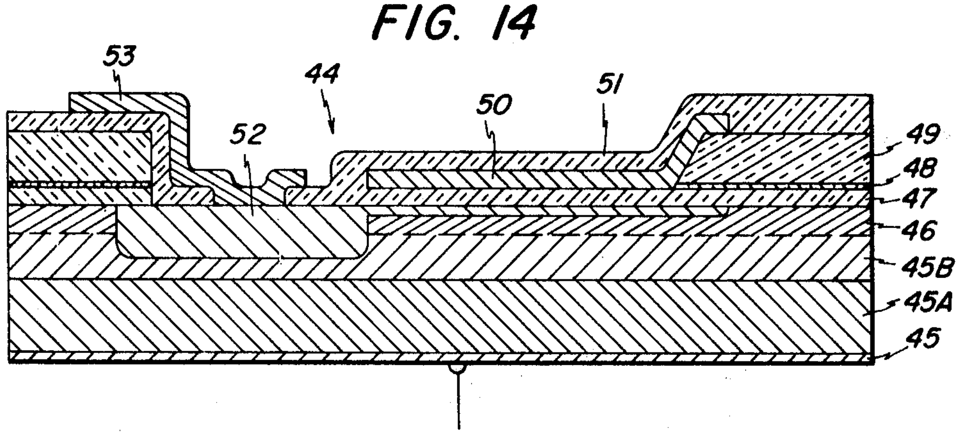
FIG. 14 is a cross-sectional view of an alternate embodiment of the invention illustrating a low resistivity surface layer over a semiconductor wafer.

In FIG. 14, a voltage-variable capacitor 44 is illustrated as comprising a wafer 45 having a first region 45A of low resistivity, such as 0.001 ohm-cm., covered by a region of high resistivity 45B, such as 10 ohm-cm. For purposes of illustration, let it be assumed that the wafer is P-type silicon. A surface-adjacent region 46 having a resistivity substantially less than that of the wafer is formed, either by diffusion or by epitaxial growth over the region 45B. The thickness of the surface-adjacent layer 46 is preferably of the order of approximately 1 micron or less.

A layer of silicon dioxide 47 is formed atop the surface-adjacent layer 46 to a thickness of typically 700 A. This layer is preferably formed by thermal growth from the silicon wafer. Over the silicon dioxide layer 47, a thin layer of silicon nitride 48 is formed, such as by reacting ammonia with the silane at 1,000°C. for a sufficient period of time to produce a silicon nitride thickness of approximately 200 A. Over the silicon nitride layer, a thick layer of silicon dioxide 49 is formed, such as by oxidation of silane at 1,000°C. The thickness of the oxide is preferably in the order of 1 micron.

To produce a region of opposite conductivity and to specify the geometrical extent of the voltage variable capacitor to be formed in the semiconductor substrate, the thick silicon dioxide layer 49 is appropriately masked with photoresist and etched with a buffered solution of hydrofluoric acid, for example, to the silicon nitride layer 48. The silicon nitride is removed in this area by etching with hot phosphoric acid, for example. Next, the entire surface of the wafer is covered with polycrystalline silicon, for example, by decomposition of silane, for example, to produce a layer of polycrystalline silicon having a suitable resistivity and thickness described in greater detail hereinafter. The layer of polycrystalline silicon is masked and etched with a suitable etchant, such as one containing 48 parts of phosphoric acid, four parts of hydrofluoric acid and one part of nitric acid to produce a control resistor 50 illustrated more clearly in FIG. 15A. The etching removes the polycrystalline silicon in all areas except for the desired pattern of the control resistor 50.

After etching, the wafer is covered with a layer of impurity-doped glass 51, such as a phosphorus-containing silicon dioxide glass, by techniques well known in the art. The wafer is then heated to a temperature sufficient to cause diffusion of the phosphorus atoms into the P-type wafer to form an N-type region 52 which extends through the low resistivity region 46 into the high resistivity portion of the wafer 45B. Typically, this diffused region 52 is of the order of 2 microns in depth. After diffusion, an aperture if formed through the phosphorus-doped glass and contact 53 is made to the N-type region 52. In a similar manner contacts 54 and 55 are made to the ends of the control resistor 50, as illustrated in FIGS. 15A and 15B.

Those skilled in the art can readily appreciate that the aforementioned description of a method for making a voltage-variable capacitor is only given for purposes of illustration and not by way of limitation. Clearly, other methods of fabricating such devices can also be employed. Accordingly, the invention is not limited solely to the method disclosed.

The devices illustrated in FIGS. 14 and 15 are particularly useful in applications requiring voltage-variable capacitors with high Q's and high surface-to-junction capacitance ratios. For example, if the semiconductor wafer of FIG. 14 has a resistivity of 10 ohm-cm. and the surface-adjacent region 46 has a resistivity of 0.1 ohm-cm., and the PN junction is formed at a depth of approximately 2 microns with the surface-adjacent region 46 extending to a depth of only 1 micron, under the effect of an electric field, a depletion width corresponding to the 10 ohm-cm. material results at the PN junction. At 1-volt bias, for example, this region extends for approximately 1.5 microns into the wafer. The surface capacitor formed in the surface-adjacent region 46 underlying the resistive layer 48 has a depletion depth of approximately 1,000 A, as this depth is characteristic of the 0.1 ohm-cm. material. Those skilled in the art can readily appreciate that a factor of 15 in gain is achieved between the capacitance per unit area of the junction as compared to the capacitance per unit area off the surface capacitor. This gain is particularly important where high Q capacitors are desired. Another important feature of this embodiment of the invention is the close proximity between the contact 52 and the resistivity layer 48. The importance of this feature with regard to the rate at which the capacitance of the device can be changed is described below.

Figure 15A:
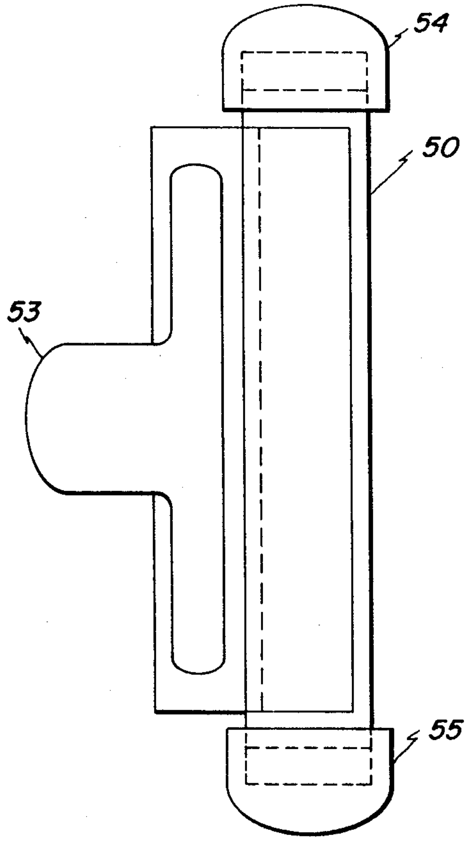
FIGS. 15A and 15B are alternate plan views of the embodiment illustrated in FIG. 14.
Figure 15B:
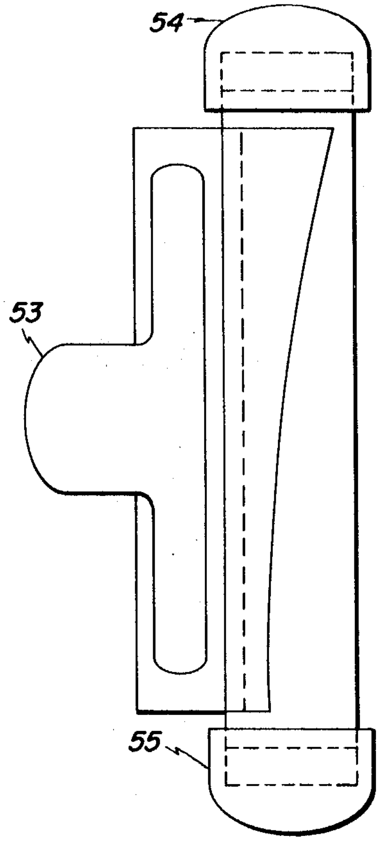

Referring to FIG. 15A, it can be seen that the length-to-width ratio of the resistive layer is much, much greater than one. The reason for this arrangement will become more readily apparent from the following description. Assume that under reverse bias conditions, the PN junction formed in the semiconductor wafer exhibits a certain junction capacitance relative to the wafer, and assume that this capacitance is $C_o$. If then the area of this PN junction is increased, the capacitance $C_o$ will similarly increase. However, if it is necessary to provide a PN junction with a given area, a low capacitance can be provided by employing a thin low resistivity surface-adjacent region over a high resistivity region on the wafer. By the use of this low resistivity surface-adjacent layer, it is possible to substantially reduce the minimum capacitance obtainable from the PN junction compared to the surface capacitance. This factor is particularly important where a large ratio of capacitance change is desired.

The embodiments of the invention illustrated in FIGS. 15A and 15B also permit operation at substantially higher frequencies than even the aforementioned embodiments of the invention for a given capacitance ratio. This results directly from the length-to-width ratio of the resistive layer and its relationship to the PN junction. More specifically, in applying a control potential between the contact pads 54 and 55 of the resistive film, a depletion region is formed under the resistive layer which extends from one end toward the other with its extent limited by the magnitude of the control voltage. As illustrated in FIG. 14, the depletion region formed under the resistive layer extends to and overlaps with the depletion region of the PN junction. Hence, the capacitance exhibited between the N-type contact and the semiconductor substrate contact varies from the minimum capacity as determined by the capacitance of the PN junction and increases to a value determined by the area underlying the resistive layer and the spacing between the resistive layer and the surface of the semiconductor wafer. As the control voltage between the contact pads of the resistive layer is increased, the depletion region formed under the resistive layer also increases and hence the capacitance exhibited by the voltage-variable capacitor similarly increases.

Since the frequency of operation of such a device is substantially similar to a distributed capacitance transmission line, it can be readily appreciated that the maximum frequency of operation is substantially proportional to the square of the width of the resistive layer. Since it is desired to provide a large change in capacitance, and since this can only be provided by having a large surface area under the resistive layer, a high-frequency device is preferably achieved by employing a resistive layer having a large length-to-width ratio.

FIG. 15B illustrates a means for providing a selectively variable capacitance change with applied voltage. This variation is achieved by altering the configuration of the resistive layer such that rather than a linear change in capacitance with voltage, a logarithmic, semilogarithmic or any other desired change can be effected. Alternately, rather than patterning the resistive layer, the thickness of the oxide underlying the resistive layer could also be patterned such that the thickness in one region is greater than that in another region. Those skilled in the art can readily appreciate the similarity between these two alternatives.

As in the other embodiments of the invention, the embodiment illustrated in FIG. 14 may be fabricated with a high sensitivity if the silicon dioxide layer 47 is very thin. Uniformly insulatingly thin films of silicon dioxide are not easily obtained, therefore the maximum sensitivity is limited primarily by the fabrication processes. Thickness of between 300 and 1,000 A. however are readily fabricated and produce acceptable results. With regard to the impurities employed in forming the various regions of the voltage variable capacitor of FIG. 14, the impurities should be selected so that fast and slow diffusants are employed to achieve the desired structure. For example, where P-type silicon is employed, gallium may be used for the slow diffusant to form the surface adjacent region of low resistivity and phosphorus used to form the N-type region. Alternately, where the wafer is N-type silicon, arsenic and antimony may be used for the slow diffusants and boron used as the fast diffusant. With regard to the control resistor, it is preferred that polycrystalline silicon having a thickness of about 500 A. and a resistance of 1,000 ohms/square be employed; however, both thinner and thicker layers may be employed. For example, thinner films provide higher resistivities, but exhibit poorer masking qualities to some impurity diffusants. In such cases, the silicon nitride layer may be left in place to aid in masking the wafer from impurity diffusion. Additionally, higher resistivity films may be employed in conjunction with thicker films consonant with series resistance limitations.

From the aforementioned description of this invention, it is readily apparent that there is disclosed a capacitor having a voltage-variable capacitance and which has a capacitance which is selectable with an independently applied voltage. The capacitor comprises a semiconductor junction in which an initial active area may be controllably extended to a desired size by establishing a surface inversion layer of controllable area in the semiconductor. The capacitance-voltage characteristic of the device may be selected by geometrically shaping the area of an electric field establishing the surface inversion layer.

The following examples are set forth to further explicate practice of this invention. These examples include specific values of the parameters involved so that the invention may be practiced by those skilled in the art. However, these examples are provided for the purpose of illustration only, and are not to be construed in a limiting sense.

EXAMPLE 1

A P-type silicon wafer of 0.1 ohm-centimeters resistivity have a major surface is etched and then oxidized at 1,000° C. for 60 hours to grow an oxide layer approximately 1 micron thick in an atmosphere of dry oxygen. This is followed by an anneal at 1,000° C. for 2 hours in a dry helium atmosphere. A photolithographically produced mask is then formed on the oxidized surface of the wafer and the oxide is etched with buffered hydrofluoric acid down to the silicon in a rectangular pattern. The device is then reoxidized at 1,000° C. for 1 hour in a dry oxygen atmosphere in order to form an oxidized region atop the silicon of approximately 700 angstroms thickness.

A layer of molybdenum 5,000 A. in thickness is next triode sputtered onto the oxidized surface of the wafer and is patterned with photolithographic techniques employing a photoresist compound to form contact areas. The molybdenum etchant comprises 76 percent orthophosphoric acid, 6 percent glacial acetic acid, 3 percent nitric acid and 15 percent water. The remaining photoresist material is removed by heating the structure for about 5 minutes in hot sulfuric acid.

A new layer of photoresist compound is deposited atop the structure and patterned according to the desired shape of the resistive layer. A resistive layer of chromium nitride is deposited by reactively sputtering chromium in a slight pressure of nitrogen, forming a sheet resistivity of approximately $10^8$ ohms per square. Silicon nitride is next deposited atop the chromium nitride layer by reactively sputtering silicon in a nitrogen atmosphere. The photoresist material together with the overlying part of the chromium nitride material and the part of the silicon nitride material overlying the aforementioned part of the chromium nitride material, are all removed by scrubbing the wafer with trichloroethylene solvent. An opening is then etched in the molybdenum region employing photolithographic techniques and the aforementioned molybdenum etchant so as to permit subsequent diffusion of donor impurities into the silicon wafer through the silicon dioxide layer.

The entire structure is next coated with phosphorus doped glass formed by pyrolytically decomposing ethyl orthosilicate and triethyl phosphate using argon carrier gas, as described in the aforementioned Brown et al. application. By heating the device for about 1½hours at 1,000° C., a diffused N-type region approximately 1 micron in depth and containing a concentration of donor impurities in the order of $10^{20}$ atoms per cubic centimeter is formed. By employing a photolithographically produced mask, buffered hydrofluoric acid is next utilized to etch a hole which passes down through the deposited glass layer, through the etched opening in the molybdenum layer, and through the silicon dioxide layer to the silicon wafer, and to etch holes down through the glass layer to make contact with the molybdenum regions. The hole etched through the silicon dioxide layer exposes a portion of the surface of the N-type diffused region in the silicon wafer.

Aluminum contact pad material is next evaporated over the entire device to a depth of about 5,000°A. By employing a photolithographically produced mask, the contact pads are formed by etching with the same etchant employed on the molybdenum for a period of about 1 minute. The wafer is then cut apart to form discrete units. Each unit is mounted on a conventional header by incorporating a gold film between the device and the header and heating the entire structure in a hydrogen atmosphere at about 410°C. Leads to the header pins are then joined to the contact pads by thermo-compression bonding.

EXAMPLE 2

This is the same as Example 1 above, but employing an N-type semiconductor wafer and a boron doped glass instead of the P-type semiconductor wafer and phosphorous doped glass respectively.

EXAMPLE 3

Same as Example 1 except that the wafer is of 1 ohm-centimeter resistivity and comprises an integrated circuit employing field effect transistors. The structure including the integrated circuitry is fabricated simultaneously according to the steps of Example 1, except that field effect transistors are produced wherever the chromium nitride deposition is omitted.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

1. A controllable voltage-variable capacitor comprising:

a semiconductor wafer of one type conductivity, said wafer containing in a first portion thereof a region of opposite type conductivity extending from one surface of said wafer to a predetermined depth therein;

electrical insulating means disposed on said one surface of a second portion of said wafer ;

electrical resistive means on said insulating means with at least an edge thereof overlapping said first portion of said wafer;

means for connecting a variable electrical control potential across said resistive means for producing a potential gradient across said resistive means and establishing a surface inversion layer of controllable length in the wafer beneath the resistive means and separate conductor means on said region of opposite type conductivity and the remainder of said wafer for supplying an output capacitance proportional to said electrical control potential 2. The controllable voltage-variable capacitor of claim 1 wherein said insulating means is a layer produced on said one surface of said wafer.

3. The controllable voltage-variable capacitor of claim 2 wherein said semiconductor wafer comprises silicon and said electrical insulating means comprises silicon dioxide.

4. A controllable voltage-variable capacitor comprising:
a semiconductor wafer of one type conductivity containing a small region of opposite type conductivity in a surface thereof;
electrical resistive means overlying said surface with insulating means separating the resistive means from the surface;
means including said resistive means for establishing an inversion layer of controllably variable length in said one type conductivity portion of said wafer in said surface with said inversion layer merging with said small region of opposite type conductivity and extending therefrom; and
conductor means respectively connected to each of said regions of one type and opposite type conductivity for connecting said capacitor in a circuit.

5. The controllable voltage-variable capacitor of claim 4 wherein said resistive means is affixed to said semiconductor wafer for establishing an electric potential gradient along said wafer.

6. The controllable voltage-variable capacitor of claim 5 wherein said means affixed to said semiconductor wafer comprises insulating means disposed atop the surface of said wafer with the resistive means disposed atop the surface of said insulating means and, said resistive means overlapping above the surface of said small region of opposite type conductivity.

7. The controllable voltage-variable capacitor of claim 6 wherein said semiconductor material comprises silicon, said insulating means comprises silicon dioxide, and said resistive means comprises one of the group consisting of amorphous silicon and chromium nitride.

8. A controllable voltage-variable capacitor comprising:
a semiconductor wafer of one type conductivity containing a small region of opposite conductivity formed in a surface thereof;
a layer of said one type conductivity at said surface having a resistivity less than that of said wafer and having a depth less than that of said opposite conductivity region;
means overlying said surface including resistive means for producing a potential gradient along said surface and establishing an inversion layer of controllably variable lengths in said layer with said inversion layer merging with said region of opposite conductivity and extending for a controllable distance therefrom; and
means connected to each of said regions of one type and opposite type conductivity for sensing capacitance of said capacitor.

9. The controllable voltage-variable capacitor of claim 8 wherein the means overlying said surface is 34 affixed to said semiconductor wafer.

10. The controllable voltage-variable capacitor of claim 9 wherein said means affixed to said semiconductor wafer comprises insulating means disposed atop the surface of said wafer and resistive means disposed atop the surface of said insulating means, said resistive means overlapping above the surface of said small region of opposite type conductivity.

11. The controllable voltage-variable capacitor of claim 10 wherein said semiconductor material comprises silicon, said insulating means comprises silicon dioxide, and said resistive means comprises one of the group consisting of amorphous silicon and chromium nitride.